US006989319B1

(12) United States Patent
Ramsbey et al.

(10) Patent No.: US 6,989,319 B1
(45) Date of Patent: *Jan. 24, 2006

(54) METHODS FOR FORMING NITROGEN-RICH REGIONS IN NON-VOLATILE SEMICONDUCTOR MEMORY DEVICES (75) Inventors: Mark Ramsbey, Sunnyvale, CA (US); Sameer Haddad, San Jose, CA (US); Vei-Han Chan, San Jose, CA (US); Yu Sun, Saratoga, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 10/718,707

(22) Filed: Nov. 24, 2003

Related U.S. Application Data (62) Division of application No. 09/143,089, filed on Aug. 28, 1998, now abandoned.

(51) Int. Cl.
*H01L 21/265* (2006.01)

(52) U.S. Cl. ............... 438/520; 438/257; 438/263; 438/266; 438/528

(58) Field of Classification Search ............. 438/162, 438/257, 263, 264, 266, 407, 520, 528, 659, 438/660, 922
See application file for complete search history.

(56) References Cited

U.S. PATENT DOCUMENTS 4,897,368 A * 1/1990 Kobushi et al. ............ 438/592

(Continued)

OTHER PUBLICATIONS

S. Nakayama, "The effect of nitrogen in P + polysilicon gates on boron penetration into silicon substrate through the gate oxide", Symposium on VLSI technology Digest of Technical papers, pp. 228-229, Jan. 1996.

(Continued)

*Primary Examiner*—Michael Trinh
*Assistant Examiner*—Khanh Duong (57) ABSTRACT Methods and arrangements are provided for significantly reducing electron trapping in semiconductor devices having a polysilicon feature and an overlying dielectric layer. The methods and arrangements employ a nitrogen-rich region within the polysilicon feature near the interface to the overlying dielectric layer. The methods include selectively implanting nitrogen ions through at least a portion of the overlying dielectric layer and into the polysilicon feature to form an initial nitrogen concentration profile within the polysilicon feature. Next, the temperature within the polysilicon feature is raised to an adequately high temperature, for example using rapid thermal anneal (RTA) techniques, which cause the initial nitrogen concentration profile to change due to the migration of the majority of the nitrogen towards either the interface with the overlying dielectric layer or the interface with an underlying layer. Consequently, the polysilicon feature has a first nitrogen-rich region near the interface to the overlying dielectric layer and a second nitrogen-rich region near the interface to the underlying layer. The migration of nitrogen further forms a contiguous reduced-nitrogen region located between the first nitrogen-rich region and the second nitrogen-rich region. The contiguous reduced-nitrogen region has a lower concentration of nitrogen than does the first nitrogen-rich region and the second nitrogen-rich region. The first nitrogen-rich region has been found to reduce electron trapping within the polysilicon feature. Thus, for example, in a non-volatile memory device wherein the polysilicon feature is a floating gate, false programming of the memory device can be significantly avoided by reducing the number of trapped electrons in the floating gate.

12 Claims, 5 Drawing Sheets

U.S. PATENT DOCUMENTS

| | | | |
|---|---|---|---|
| 5,801,425 A | * | 9/1998 | Kuroi et al. .................. 257/383 |
| 5,837,585 A | * | 11/1998 | Wu et al. .................... 438/264 |
| 5,866,930 A | | 2/1999 | Saida et al. |
| 5,937,301 A | * | 8/1999 | Gardner et al. ............. 438/303 |
| 6,001,713 A | * | 12/1999 | Ramsbey et al. ........... 438/520 |
| 6,017,808 A | | 1/2000 | Wang et al. |
| 6,069,041 A | * | 5/2000 | Tanigami et al. ........... 438/261 |
| 6,093,661 A | * | 7/2000 | Trivedi et al. .............. 438/769 |
| 6,252,276 B1 | * | 6/2001 | Ramsbey et al. ........... 257/321 |

OTHER PUBLICATIONS

T. Kuroi et al., "Novel NICE (Nitrogen Implantation into CMOS Gate Electrode and Source-Drain) Structure for High Reliability and High Performance 0.25 um Dual Gate CMOS", IEDM, pp. 325-328, Jan. 1996.

* cited by examiner

METHODS FOR FORMING NITROGEN-RICH REGIONS IN NON-VOLATILE SEMICONDUCTOR MEMORY DEVICES

This application is a divisional of application Ser. No. 09/143,089 filed Aug. 28, 1998 now abandoned.

TECHNICAL FIELD

The present invention relates to semiconductor devices and manufacturing processes, and more particularly to methods and arrangements for effectively reducing false programming within non-volatile memory semiconductor devices that can occur as a result of electron trapping near the interface between a floating gate and an interpoly dielectric layer.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

Figure 1A:
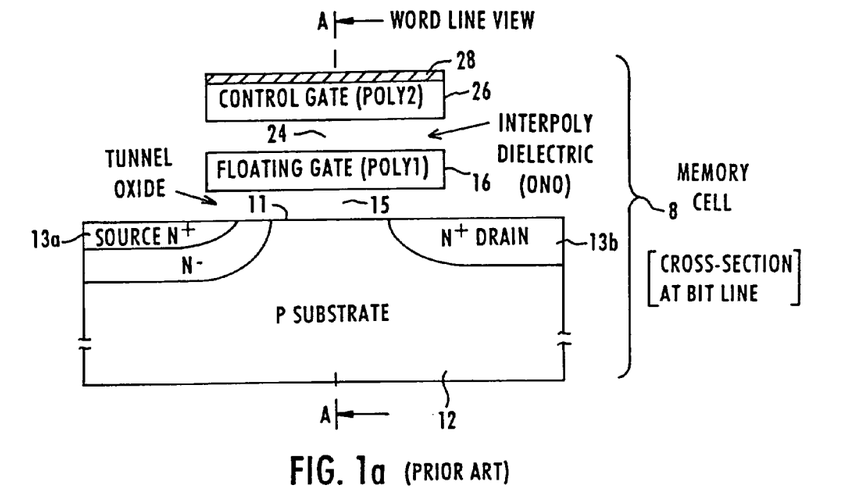
FIG. 1a depicts a cross-sectional view of a portion of a typical prior art semiconductor device having at least one memory cell, as viewed at the bit-line.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge needs to be removed from floating gate 16 by way of an erasure voltage applied to source 13a.

Figure 1B:
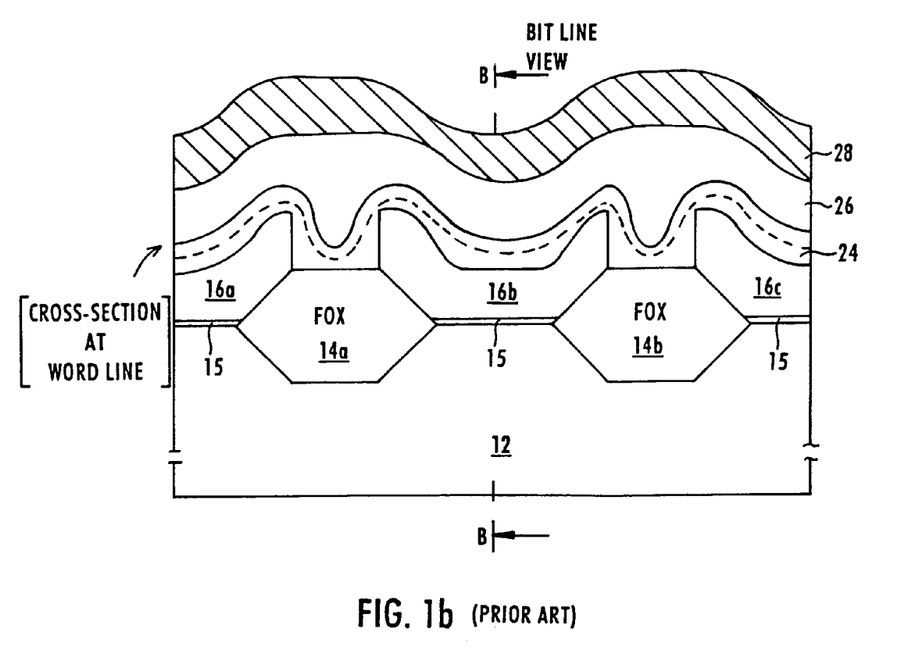
FIG. 1b depicts a cross-sectional view of a portion of a typical prior art semiconductor device, as in FIG. 1a, having at least one memory cell, as viewed at the word-line.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer. The thickness and physical properties of interpoly dielectric layer 24 affect the data retention capabilities of memory cell 8.

The continued shrinking of the memory cells, for example, as depicted in the memory cells of FIGS. 1a–b, requires that floating gates 16a–c be reduced in size (e.g., reduced width, length and/or height). The resulting reduced-size memory cell is typically operated with an attendant reduction in the threshold level of electrical charge that is required to program floating gate 16 to a binary 1 state. By way of example, in certain reduced-size memory cells, a binary 1 state can be represented by the electrical charge provided by as few as 5,000 electrons stored within floating gate 16. Consequently, there is a potential for false programming of the memory cell if an appropriate number of unwanted free electrons are allowed to migrate into, or otherwise charge, floating gate 16. In particular, it has been found that in certain memory cells electrons can be trapped near the interface between the floating gate 16 and the overlying interpoly dielectric layer 24 during fabrication. In certain instances these trapped electrons can escape from the trapping mechanism, for example, due to subsequent thermal changes and/or the passage of time. Once released, these unwanted electrons can falsely program floating gate 16 (e.g., to a binary 1 state). Thus, there is need for methods and arrangements that effectively reduce the potential for electron trapping, and/or false programming as a result thereof, at or near the interface between floating gate 16 and interpoly dielectric layer 24.

SUMMARY OF THE INVENTION

These needs and others are met by the present invention, which provides methods and arrangements that effectively reduce the potential for electron trapping in a polysilicon feature in a semiconductor device by advantageously employing a nitrogen-rich region within the polysilicon feature near the interface between the polysilicon feature and an overlying dielectric layer. Because the nitrogen-rich region significantly reduces the electron-trap density near this interface, the resulting semiconductor device is much less likely to be falsely programmed or otherwise significantly affected due to the subsequent release of trapped electrons.

Thus, in accordance with certain embodiments of the present invention, there is provided a semiconductor device having a first dielectric layer, a first gate formed on the first dielectric layer, and a second dielectric layer formed on the first gate. The first gate includes a first nitrogen-rich region that is located substantially adjacent the first dielectric layer, and a substantially separate second nitrogen-rich region that is located substantially adjacent the second dielectric layer. There is also a reduced-nitrogen region within the first gate. The reduced-nitrogen region is located between the first nitrogen-rich region and the second nitrogen-rich region and has a lower concentration of nitrogen than both the first nitrogen-rich region and the second nitrogen-rich region. In certain embodiments the second dielectric layer includes a plurality of films selected from a group comprising silicon dioxide and silicon nitride and the first gate includes polysilicon. In certain embodiments, the first nitrogen-rich region has between about 0.01% and about 1% atomic percentage of nitrogen and the second nitrogen-rich region has between about 0.01% and about 1% atomic percentage of nitrogen. In still other embodiments, the lower concentration of nitrogen in the reduced-nitrogen region is less than about 0.001% atomic percentage of nitrogen.

The above stated needs and others are also met by a method for forming a semiconductor device, in accordance with still further embodiments of the present invention. The method includes forming a first dielectric layer, forming a first gate on the first dielectric layer, forming at least a portion of a second dielectric layer on the first gate, and forming a first nitrogen-rich region within the first gate substantially adjacent the first dielectric layer, and a second nitrogen-rich region within the first gate substantially adjacent the second dielectric layer. In certain embodiments, the step of forming the first nitrogen-rich region and the second nitrogen-rich region within the first gate further includes the steps of implanting nitrogen ions through the second dielectric layer and into the first gate, the implanted nitrogen ions forming a first nitrogen concentration profile within the first layer, and causing the first nitrogen concentration profile to be altered to form a second nitrogen concentration profile within the first gate. The second nitrogen concentration profile includes a first nitrogen-rich region, a second nitrogen-rich region and a reduced-nitrogen region located between the first nitrogen-rich region and the second nitrogen-rich region. The reduced-nitrogen region has a lower concentration of nitrogen than the first nitrogen-rich region and the second nitrogen-rich region. By way of example, in accordance with still other certain embodiments of the present invention, the step of causing the first nitrogen concentration profile to be altered includes the steps of causing the first nitrogen-rich region to include between about 0.01% and about 1% atomic percentage of nitrogen, causing the second nitrogen-rich region to include between about 0.01% and about 1% atomic percentage of nitrogen, and/or causing the lower concentration of nitrogen in the reduced-nitrogen region to include less than about 0.001% atomic percentage of nitrogen. In certain further embodiments, the step of forming at least a portion of a second dielectric layer on the first gate includes forming a first silicon dioxide film on the first gate prior to the step of forming the first nitrogen-rich region and the second nitrogen-rich region within the first gate. While in still other embodiments, the step of forming at least a portion of a second dielectric layer on the first gate can also include the step of forming a silicon nitride film on the first silicon dioxide film prior to the step of forming the first nitrogen-rich region and the second nitrogen-rich region within the first gate, and or even the step of forming a second silicon dioxide film on the first silicon dioxide film prior to the step of the step of forming the first nitrogen-rich region and the second nitrogen-rich region within the first gate. In certain exemplary embodiments, the step of implanting nitrogen ions through the second dielectric layer and into the first gate uses an ion implantation energy of between about 10 and about 30 KeV to provide a dosage of between about $1\times10^{14}$ and about $1\times10^{16}$ nitrogen ions/cm$^2$. The resulting first nitrogen concentration profile is then altered to form a second nitrogen concentration profile within the first gate by applying thermal energy to the first gate. For example, in certain embodiments, the internal temperature within the first gate is raised to between about 900 and about 1100° C. for a predetermined period of time.

In accordance with still further embodiments of the present invention, a method for doping a polysilicon layer with nitrogen is provided. The method includes the steps of forming a polysilicon layer in a semiconductor device, the polysilicon layer sharing a first interface with an underlying dielectric layer and a second interface with an overlying dielectric layer, implanting nitrogen through the overlying dielectric layer and substantially into a polysilicon layer, and heating the polysilicon layer to cause the implanted nitrogen to form a first nitrogen-rich region substantially adjacent to the underlying dielectric layer and a substantially separate second nitrogen-rich region substantially adjacent the overlying dielectric layer. This leaves a reduced-nitrogen region within the polysilicon layer between the first nitrogen-rich region and the second nitrogen-rich region. As such, the reduced-nitrogen region has a lower concentration of nitrogen than the first nitrogen-rich region and the second nitrogen-rich region.

In accordance with still further embodiments of the present invention a method for reducing electron-trap density at an interface in a semiconductor device is provided. The method includes the steps of forming a gate, forming a dielectric layer on the gate to create a gate/dielectric interface, and then implanting ions through the dielectric layer and into the gate, whereby the ions reduce the electron-trap density at the gate/dielectric interface. In certain embodiments, the method includes altering a profile of a concentration of the ions in the gate such that an ion-rich region is formed at the gate/dielectric interface. The ions are selected for their ability to reduce the electron-trap density near at or near the interface, without significantly affecting the function of the gate. By way of example, nitrogen ions have been found to reduce the electron-trapping in doped polysilicon gates. In certain embodiments, the step of altering the profile includes heating the gate, for example by using a rapid thermal anneal (RTA).

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 2A:
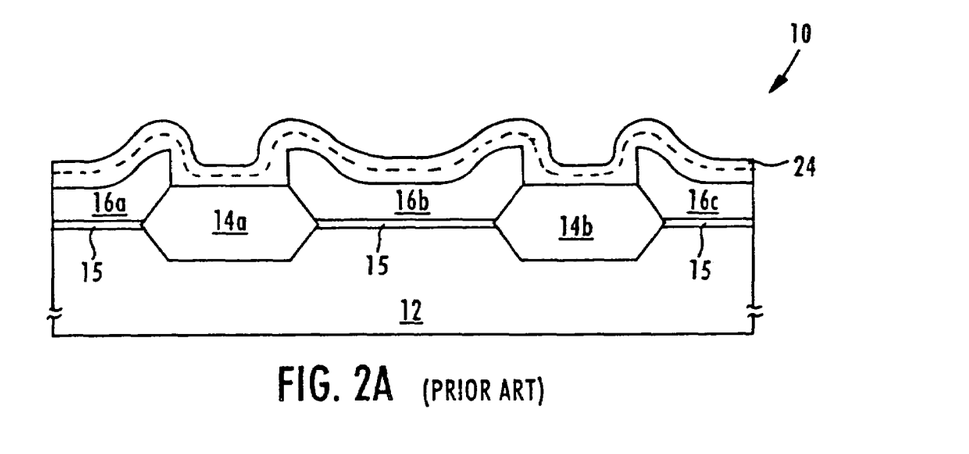
FIG. 2a depicts a cross-sectional view of a portion of a typical prior art semiconductor device, as in FIGS. 1a–b, following deposition of an interpoly dielectric layer over a plurality of patterned floating gates.

FIG. 2a depicts an exemplary cross-sectional view of a portion 10 of a typical prior art semiconductor, similar to FIGS. 1a–b, following the formation of floating gates 16a–c and the formation of interpoly dielectric layer 24 thereon. Floating gates 16a–c are typically formed by depositing a conformal layer of doped polysilicon over the exposed surfaces of the field oxides 14a–b and tunnel oxide 15 regions of the semiconductor wafer. The layer of doped polysilicon can be formed using conventional chemical vapor deposition (CVD) or plasma enhanced chemical vapor deposition (PECVD) techniques, or the like. Next, the layer of doped polysilicon is selectively etched to electrically isolate a plurality of floating gates, such as floating gates 16a–c. The selective etching process exposes portions of the top surface of field oxide 14a between floating gates 16a and 16b, and field oxide 14b between floating gates 16b and 16c. The selective etching process typically includes forming a resist mask (not shown) on the layer of doped polysilicon and etching away exposed portions of the doped polysilicon layer and stopping on the underlying field oxides (e.g., 14a–b).

Figure 2B:
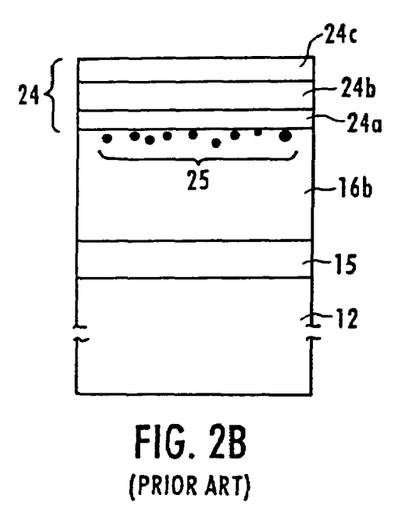
FIG. 2b depicts an enlarged view of part of a floating gate as depicted in the portion of FIG. 2a, which shows that the interpoly dielectric layer is comprised of a plurality of films, including a first silicon dioxide film, a silicon nitride film and then a second silicon dioxide film, and that electrons can be trapped at or near the interface between the floating gate and the first silicon dioxide film during fabrication.

As depicted in the enlarged view of portion 10 in FIG. 2b, interpoly dielectric layer 24 is typically formed over the floating gates 16a–c and field oxides 14a–b by sequentially depositing a plurality of dielectric films (e.g., films 24a–c). For example, in an exemplary embodiment interpoly dielectric layer 24 is an "ONO layer" that includes a first silicon dioxide film 24a formed on floating gate 16b (and on field oxides 14a–b as shown in FIG. 2a), a silicon nitride film 24b formed on first silicon dioxide film 24a, and a second silicon dioxide film 24c formed on silicon nitride film 24b. Films 24a–c are typically formed using conventional thermal, CVD, and/or PECVD deposition techniques. For example, in certain embodiments the first silicon dioxide film 24a is about 50 Angstroms thick and formed using conventional thermal oxide deposition techniques, the silicon nitride film 24b is about 80 Angstroms thick and formed using conventional CVD or PECVD techniques, and the second silicon dioxide layer 24c is about 40 Angstroms thick and formed using conventional CVD or PECVD techniques.

Figure 2C:
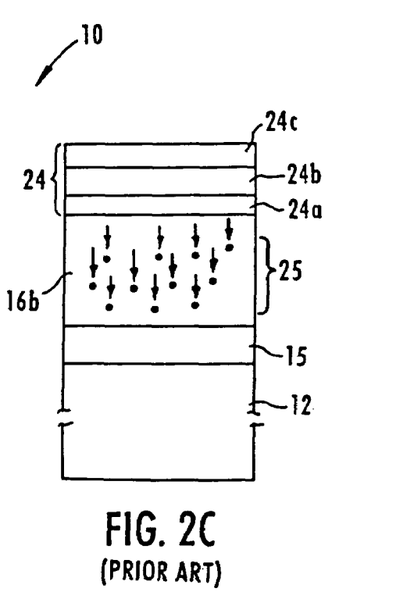
FIG. 2c depicts the enlarged view of FIG. 2.b, wherein at least a portion of the trapped electrons are no longer trapped and have migrated within the floating gate, thereby causing the floating gate to become falsely programmed, for example, to a binary 1 state rather than a binary 0 state (as intended)

A plurality of trapped electrons 25 are also depicted within the floating gate 16b, at or near the interface of the overlying first silicon dioxide film 24a. It is believed that defects are introduced near the top surface of floating gate 16b during the formation of the first silicon dioxide film 24a, and that these defects include the trapped electrons 25, and/or lead to the formation of mechanisms that trap electrons. It has been found that the trapped electrons 25 cannot be adequately removed during subsequent semiconductor device erase processes. Further, it has been found that many of the trapped electrons can break free of their trapping mechanisms during the lifetime of the semiconductor device and migrate away from the interface and into the interior regions of floating gate 16b, for example, as depicted in FIG. 2c. It is believed that thermal cycling of the semiconductor device during the operational lifetime tends to increase the migration of previously trapped electrons 25. Consequently, in certain semiconductor devices, especially reduced-size memory devices, this later migration of previously trapped electrons 25 can lead to false programming of floating gate 16b, thereby rendering the semiconductor device unreliable.

Figure 3:
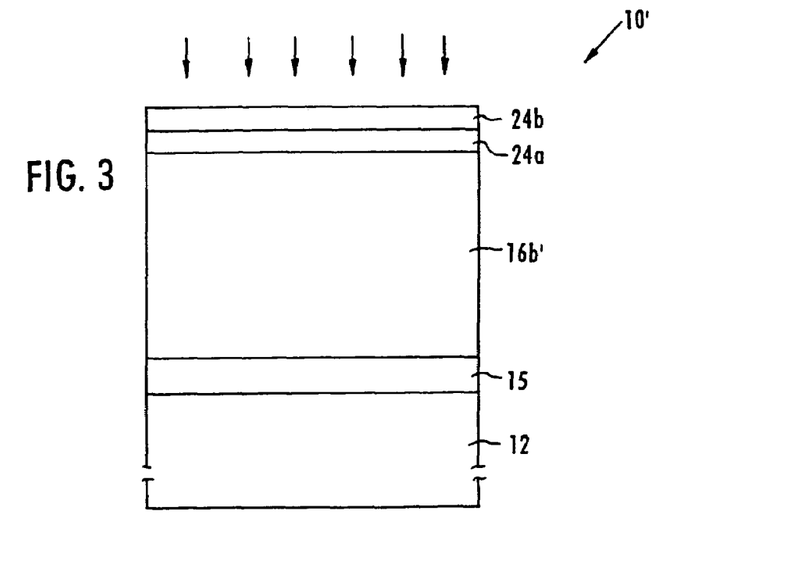
FIG. 3 depicts a cross-sectional view of a portion of a semiconductor device having a portion of the interpoly dielectric layer, including a first silicon dioxide film and a silicon nitride film, formed over a floating gate, and wherein nitrogen ions are being implanted into the portion to create an initial nitrogen concentration profile substantially within the floating gate, in accordance with certain exemplary embodiments of the present invention.

FIG. 3 depicts a cross-sectional view of a portion 10' of an exemplary semiconductor device, in accordance with certain embodiments of the present invention. Portion 10' includes a substrate 12, upon which a tunnel oxide 15 has been formed to a thickness of about 50 Angstroms, using conventional thermal deposition techniques. A floating gate 16b' is formed on tunnel oxide 15 to a thickness of between about 300 and about 2500 Angstroms, again using conventional deposition and patterning techniques, for example, as described above with regard to FIG. 2a. A first silicon dioxide film 24a is formed on floating gate 16b' to thickness of between about 30 and about 150 Angstroms using conventional thermal deposition processes. Next, a silicon nitride film 24b is formed on first silicon dioxide film 24a to thickness of between about 50 and about 150 Angstroms using conventional chemical vapor deposition CVD or like processes.

While the exact mechanisms are not fully understood, it has been found that the density of trapped electrons can be significantly reduced, if not substantially eliminated, by providing nitrogen near the interface of floating gate 16b' and first silicon dioxide 24a. With this in mind, nitrogen ions are implanted, for example, using conventional ion implantation techniques, through the silicon nitride film 24b and first silicon dioxide film 24a, and into floating gate 16b'. For example, in accordance with certain exemplary embodiments of the present invention, an ion implantation energy of between about 10 and about 30 KeV in a dosage of between about $1\times10^{14}$ and about $1\times10^{16}$ ions/cm$^2$, and more preferably about $5\times10^{15}$ ions/cm$^2$, is used to implant nitrogen into floating gate 16b'.

Methods for implanting nitrogen ions for other specific purposes are known on the art. For example, U.S. Pat. No. 4,774,197, which is hereby incorporated in the present application, in its entirety and for all purposes, describes implanting nitrogen ions to prevent the incursion of impurities into the tunnel oxide, which would degrade the quality of the tunnel oxide.

Figure 4:
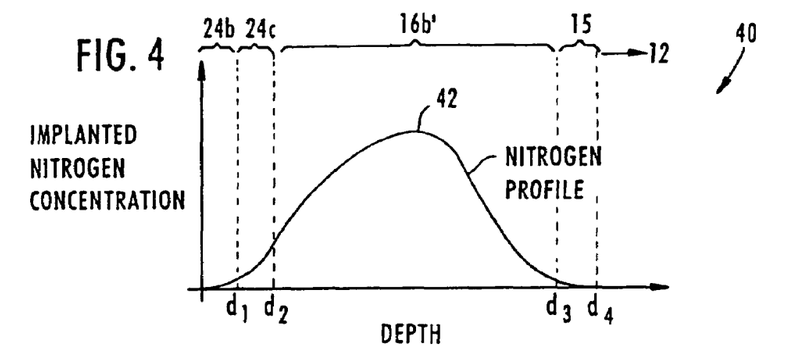
FIG. 4 is a graph depicting an initial nitrogen concentration profile as implanted within the portion as depicted, for example, in FIG. 3, wherein the resulting nitrogen concentration profile has a bell shape that is substantially located within the thickness of the floating gate, in accordance with certain exemplary embodiments of the present invention.

The implantation of nitrogen into portion 10' creates an initial nitrogen concentration profile substantially within the floating gate 16b', in accordance with certain exemplary embodiments of the present invention. By way of example, graph 40 in of FIG. 4 depicts an initial nitrogen concentration profile 42, as is implanted within portion 10' in FIG. 3, in accordance with certain preferred embodiments of the present invention. As shown, the resulting nitrogen concentration profile 42 has a higher concentration of nitrogen located substantially within the thickness of the floating gate 16b'. For example, the concentration of nitrogen, as measured as an atomic percentage of the material within floating gate 16b', is preferably between about 0.01% and about 1% percent and varies as a function of the thickness of floating gate 16b'.

Once floating gate 16b' has been implanted with nitrogen, a subsequent conventional thermal processing step is employed to alter the initial nitrogen concentration profile 42. The thermal processing step preferably raises the temperature within floating gate 16b' to between about 900 and about 1100° C., which causes the implanted nitrogen that is substantially within floating gate 16b' to migrate or to be otherwise repositioned substantially within floating gate 16b'.

Figure 5:
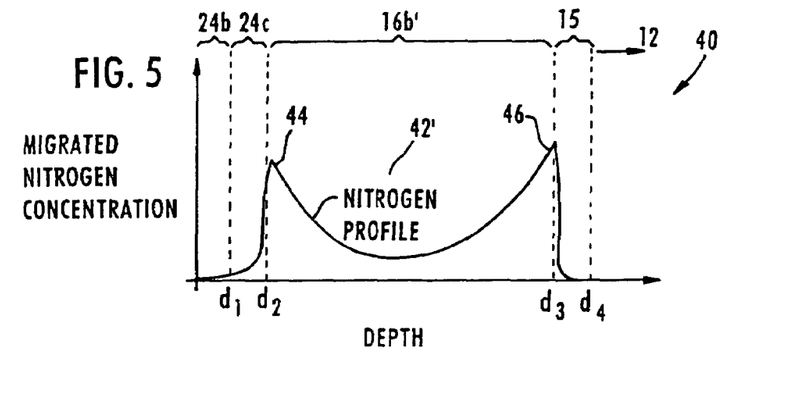
FIG. 5 is a graph, based on FIG. 4, depicting a migrated nitrogen concentration profile following subsequent thermal processing (e.g., a thermal anneal process) of the initial nitrogen concentration profile portion within the floating gate, wherein the graph clearly shows that the migrated nitrogen concentration profile includes a top nitrogen-rich region near the interface between the floating gate and the overlying first silicon dioxide film, and a bottom nitrogen-rich region near the interface between the floating gate and the underlying tunnel oxide, in accordance with certain exemplary embodiments of the present invention.

Graph 40 has been altered in FIG. 5 to depict a migrated nitrogen concentration profile 42' following subsequent thermal processing, for example, using conventional thermal anneal process techniques. As shown, migrated nitrogen concentration profile 42' includes a top nitrogen-rich region 44 near the interface between floating gate 16b' and the overlying first silicon dioxide film 24a, and a bottom nitrogen-rich region 46 near the interface between floating gate 16b' and the underlying tunnel oxide 15, in accordance with certain exemplary embodiments of the present invention. In certain cases, substantially all of the implanted nitrogen within floating gate 16b' migrates towards either of these interfaces to form region 44 and/or 46, thereby leaving only a negligible concentration of nitrogen therebetween. By way of example, an exemplary anneal process employs a Centura available from Applied Material of Santa Clara, Calif. to raise the temperature of floating gate 16b to between about 900 and about 1100° C. for a period of between about 10 and about 60 seconds.

Figure 6:
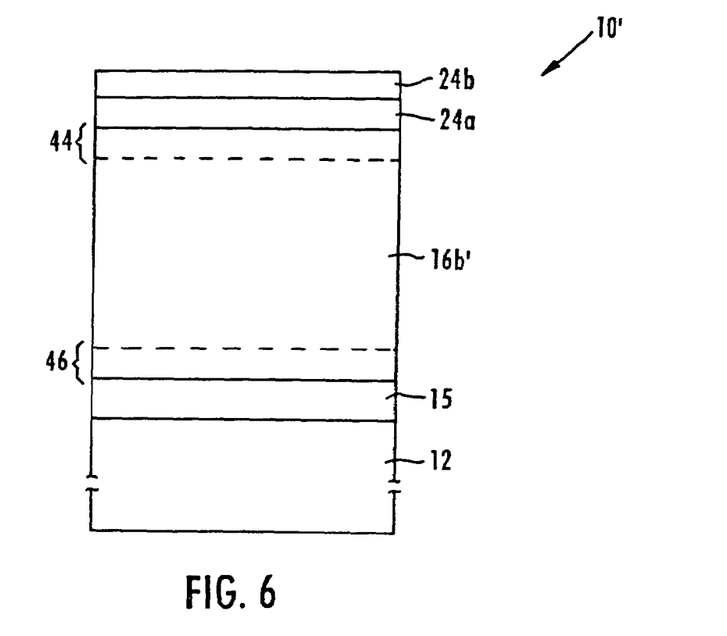
FIG. 6 depicts the portion of FIG. 3 having a migrated nitrogen concentration profile, for example, as depicted in FIG. 5, following thermal processing, which includes a top nitrogen-rich region near the interface between the floating gate and the overlying first silicon dioxide film, and a bottom nitrogen-rich region near the interface between the floating gate and the underlying tunnel oxide, in accordance with certain exemplary embodiments of the present invention.

Thus, the density of trapped electrons in floating gate 16b', for example as depicted in FIG. 6 is significantly reduced, if not substantially eliminated, because of top nitrogen-rich region 44 located near the interface of floating gate 16b' and first silicon dioxide 24a. Further, bottom nitrogen-rich region 46 can, in certain semiconductor devices, increase the charge retention capabilities of floating gate 16b' and/or reduce electron trapping that can occur near the interface to tunnel oxide 15.

Figure 7:
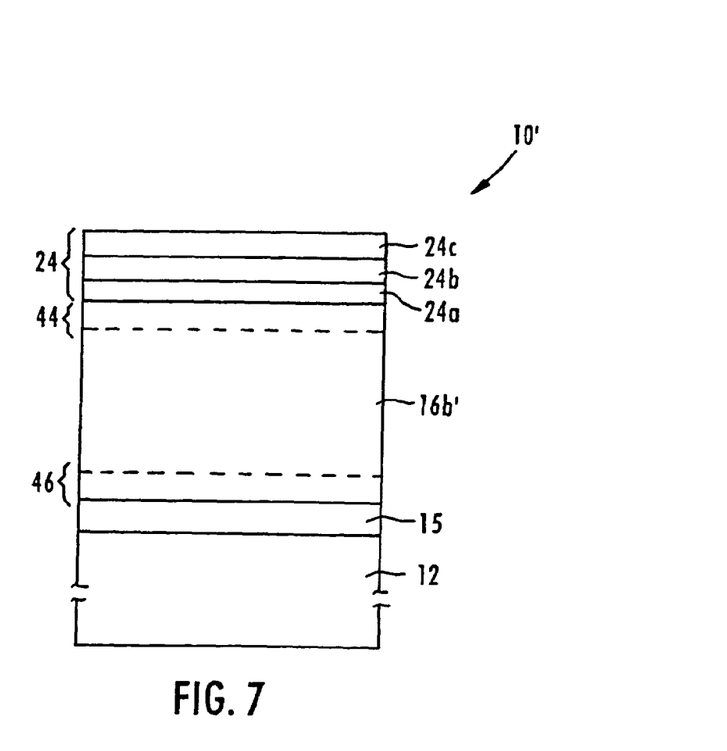
FIG. 7 depicts the portion of FIG. 6 following formation of a second silicon dioxide film on the silicon nitride film to complete the formation of the interpoly dielectric layer, in accordance with certain exemplary embodiments of the present invention.

FIG. 7 depicts the portion of FIG. 6 following formation of a second silicon dioxide film 24c on silicon nitride film 24b, which completes the formation of the interpoly dielectric layer 24, in accordance with certain exemplary embodiments of the present invention. For example, second silicon dioxide film 24c can be deposited to a thickness of between about 20 and about 80 Angstroms using conventional CVD or like techniques.

In the exemplary embodiment described above and depicted in FIGS. 3–7, the nitrogen is preferably implanted into floating gate 16b' following the formation of the first silicon dioxide film 24a and silicon nitride film 24b, because this reduces the potential for causing damage to the first silicon dioxide film 24a, for example due to charging during the nitrogen ion implantation process. However, in accordance with still other embodiments of the present invention, the ion implantation process can be employed at other stages in the fabrication process.

Figure 8A:
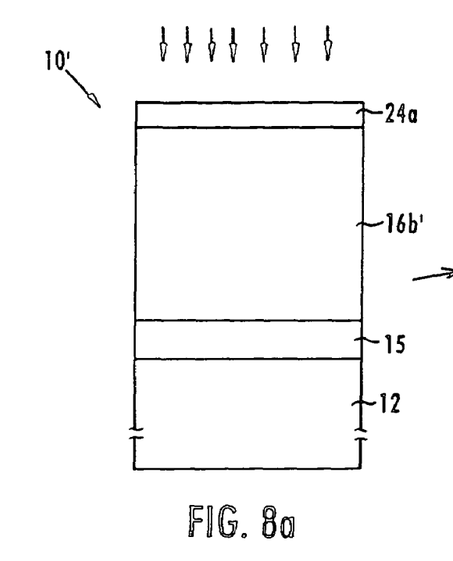
FIG. 8a depicts a cross-sectional view of a portion of a semiconductor device having a first silicon dioxide film formed over a floating gate, and wherein nitrogen ions are implanted into the portion to create an initial nitrogen concentration profile substantially within the floating gate, in accordance with certain other embodiments of the present invention.
Figure 8B:
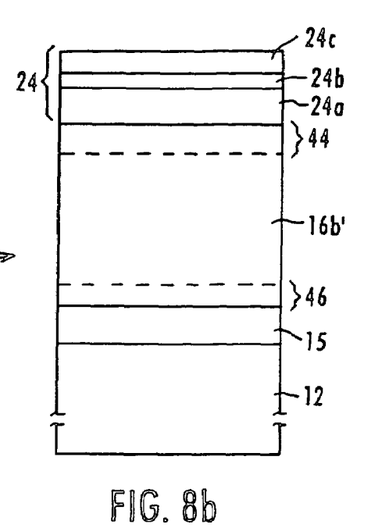
FIG. 8b depicts the portion of FIG. 8a having a migrated nitrogen concentration profile, for example, as depicted in FIG. 5, which includes a top nitrogen-rich region near the interface between the floating gate and the overlying first silicon dioxide film, and a bottom nitrogen-rich region near the interface between the floating gate and the underlying tunnel oxide, and following formation of a silicon nitride film and second silicon dioxide film on the first silicon dioxide film to complete the formation of the interpoly dielectric layer, in accordance with certain other embodiments of the present invention.

By way of example, FIG. 8a depicts a cross-sectional view of portion 10', having only the first silicon dioxide film 24a formed over floating gate 16b', into which nitrogen ions are implanted to create an initial nitrogen concentration profile 42 substantially within floating gate 16b', in accordance with certain other embodiments of the present invention. FIG. 8b depicts portion 10' of FIG. 8a having a migrated nitrogen concentration profile 42' (for example, as depicted in FIG. 5), following a thermal processing step, which causes top nitrogen-rich region 44 and bottom nitrogen-rich region 46 to form, and following formation of silicon nitride film 24b and second silicon dioxide film 24c to complete the formation of the interpoly dielectric layer 24.

Figure 9A:
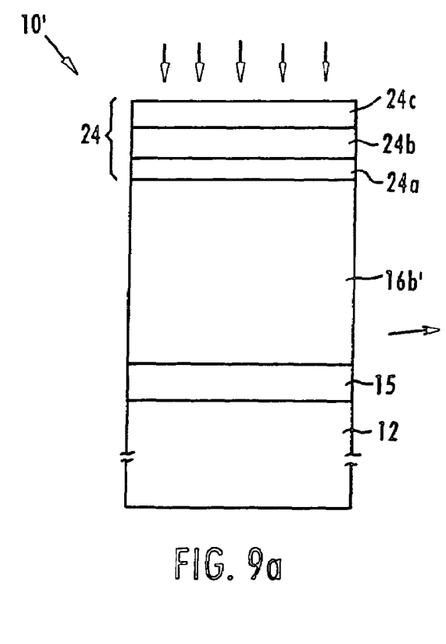
FIG. 9a depicts yet another cross-sectional view of a portion of a semiconductor device having a interpoly dielectric layer, including a first silicon dioxide film, a silicon nitride film and a second silicon dioxide film, formed over a floating gate, and wherein nitrogen ions are implanted into the portion to create an initial nitrogen concentration profile substantially within the floating gate, in accordance with certain further embodiments of the present invention.
Figure 9B:
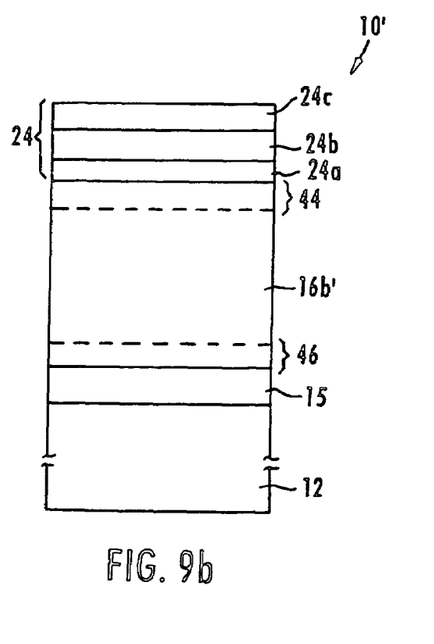
FIG. 9b depicts the portion of FIG. 9a having a migrated nitrogen concentration profile, for example, as depicted in FIG. 5, which includes a top nitrogen-rich region near the interface between the floating gate and the overlying first silicon dioxide film, and a bottom nitrogen-rich region near the interface between the floating gate and the underlying tunnel oxide, in accordance with certain other embodiments of the present invention.

Similarly, FIG. 9a depicts cross-sectional view of portion 10' having a completed interpoly dielectric layer 24 (i.e., including first silicon dioxide film 24a, silicon nitride film 24b, and second silicon dioxide film 24c) formed over floating gate 16b', in which nitrogen ions are implanted to create an initial nitrogen profile 42 substantially within floating gate 16b', in accordance with still other embodiments of the present invention. FIG. 9b depicts portion 10' of FIG. 9a having a migrated nitrogen concentration profile 42' (for example, as depicted in FIG. 5), following a thermal processing step, which causes top nitrogen-rich region 44 and bottom nitrogen-rich region 46 to form.

Using the ion implantation of nitrogen and subsequent thermal processing to create a desired nitrogen concentration profile in a floating gate, the embodiments of the present invention reduces the electron-trap density at the floating gate interface. This reduces the probability of false programming of the semiconductor device.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a semiconductor device, the method comprising:
    forming a first dielectric layer;
    forming a first gate on the first dielectric layer;
    forming a second dielectric layer on the first gate;
    forming a silicon nitride film on the second dielectric layer; and then
    forming a first nitrogen-rich region within the first gate and substantially adjacent to the first dielectric layer, and a second nitrogen-rich region within the first gate and substantially adjacent the second dielectric layer, wherein
    the silicon nitride film is formed on the second dielectric layer prior to the step of forming the first nitrogen-rich region and the second nitrogen-rich region within the first gate.

2. The method as recited in claim 1, wherein the step of forming a second dielectric layer on the first gate includes forming a first silicon dioxide film on the first gate.

3. The method as recited in claim 2, wherein the step of forming a second dielectric layer on the first gate further includes forming a silicon nitride film on the first silicon dioxide film prior to the step of forming the first nitrogen-rich region and the second nitrogen-rich region within the first gate.

4. The method as recited in claim 3, wherein the step of forming a second dielectric layer on the first gate further includes forming a second silicon dioxide film on the silicon nitride film prior to the step of the step of forming the first nitrogen-rich region and the second nitrogen-rich region within the first gate.

5. A method for forming a semiconductor device, the method comprising:
    forming a first dielectric layer;
    forming a first gate on the first dielectric layer;
    forming a second dielectric layer on the first gate; and then
    forming a first nitrogen-rich region within the first gate and substantially adjacent to the first dielectric layer, and a second nitrogen-rich region within the first gate and substantially adjacent the second dielectric layer, wherein the step of forming the first nitrogen-rich region and the second nitrogen-rich region within the first gate further comprises:
    implanting nitrogen ions through the second dielectric layer and into the first gate, the implanted nitrogen ions forming a first nitrogen concentration profile within the first gate; and
    causing the first nitrogen concentration profile to be altered to form a second nitrogen concentration profile within the first gate, the second nitrogen concentration profile comprising the first nitrogen-rich region, the second nitrogen-rich region and a contiguous reduced-nitrogen region located between the first nitrogen-rich region and the second nitrogen-rich region, the contiguous reduced-nitrogen region having a lower concentration of nitrogen than the first nitrogen-rich region and the second nitrogen-rich region.

6. The method as recited in claim 5, wherein the step of causing the first nitrogen concentration profile to be altered further comprises causing the first nitrogen-rich region to include between about 0.01% and about 1% atomic percentage of nitrogen.

7. The method as recited in claim 6, wherein the step of the step of causing the first nitrogen concentration profile to be altered further comprises causing the second nitrogen-rich region to include between about 0.01% and about 1% atomic percentage of nitrogen.

8. The method as recited in claim 5, wherein the step of causing the first nitrogen concentration profile to be altered to form the second nitrogen concentration profile within the first gate further comprises causing the lower concentration of nitrogen in the contiguous reduced-nitrogen region to include less than about 0.001% atomic percentage of nitrogen.

9. The method as recited in claim 5, wherein the step of implanting nitrogen ions through the second dielectric layer and into the first gate uses an ion implantation energy of between about 10 and about 30 KeV to provide a dosage of between about $1 \times 10^{14}$ and about $1 \times 10^{16}$ nitrogen ions/cm$^2$.

10. The method as recited in claim 5, wherein the step of causing the first nitrogen concentration profile to be altered to form a second nitrogen concentration profile within the first gate further includes applying thermal energy to the first gate.

11. The method as recited in claim 10, wherein the step of applying thermal energy to the first gate causes an internal temperature within the first gate of between about 900 and about 1100° C.

12. A method for nitrogen doping a polysilicon layer, the method comprising:

forming a polysilicon layer in a semiconductor device, the polysilicon layer sharing a first interface with an underlying dielectric layer and a second interface with an overlying dielectric layer;

implanting nitrogen through the overlying dielectric layer and substantially into a polysilicon layer; and heating the polysilicon layer to cause the implanted nitrogen to form a first nitrogen-rich region substantially adjacent to the underlying dielectric layer and a substantially separate second nitrogen-rich region substantially adjacent the overlying dielectric layer, thereby leaving a reduced-nitrogen region located within the polysilicon layer between the first nitrogen-rich region and the second nitrogen-rich region, wherein the reduced-nitrogen region always has a lower concentration of nitrogen than the first nitrogen-rich region and the second nitrogen-rich region.

* * * * *